United States Patent
Bedell et al.

(10) Patent No.: US 7,125,458 B2
(45) Date of Patent: Oct. 24, 2006

(54) FORMATION OF A SILICON GERMANIUM-ON-INSULATOR STRUCTURE BY OXIDATION OF A BURIED POROUS SILICON LAYER

(75) Inventors: Stephen W. Bedell, Wappingers Falls, NY (US); Kwang Su Choe, Sungnam-Shi (KR); Keith E. Fogel, Mohegan Lake, NY (US); Devendra K. Sadana, Pleasantville, NY (US)

(73) Assignee: International Business Machines Corporation, Armonk, NY (US)

(*) Notice: Subject to any disclaimer, the term of this patent is extended or adjusted under 35 U.S.C. 154(b) by 373 days.

(21) Appl. No.: 10/662,028

(22) Filed: Sep. 12, 2003

(65) Prior Publication Data

US 2005/0056352 A1    Mar. 17, 2005

(51) Int. Cl.
   *H01L 21/20*     (2006.01)
(52) U.S. Cl. .................. 148/239; 148/277; 148/279; 148/518; 205/123; 205/157; 438/479; 438/480
(58) Field of Classification Search ................ 198/239, 198/277, 279, 518; 205/123, 157; 438/479, 438/480
   See application file for complete search history.

(56) References Cited

U.S. PATENT DOCUMENTS

| | | | |
|---|---|---|---|
| 4,104,090 A | 8/1978 | Pogge et al. | |
| 5,686,343 A | 11/1997 | Lee et al. | |
| 6,812,116 B1 * | 11/2004 | Huang et al. | 438/464 |
| 6,828,214 B1 * | 12/2004 | Notsu et al. | 438/455 |

OTHER PUBLICATIONS

Mizuno, et al., "High Performance CMOS Operation of Strained-SOI MOSFETs Using Thin Film SiGe-On-Insulator Substrate", 2002 Symposium on VLSI Technology, Digest of Technical Papers, Honolulu, Jun. 11-13, 2002, Symposium on VLSI Technology, New York, NY: IEEE, US, Jun. 11, 2002, pp. 106-107, XP001109839.
Patent Abstracts of Japan, vol. 005, No. 181 (E-083), Nov. 20, 1981, 56-110247.
Patent Abstracts of Japan, vol. 005, No. 117 (E-067), May 18, 1981, 56-056648.

* cited by examiner

*Primary Examiner*—George Wyszomierski
(74) *Attorney, Agent, or Firm*—Scully, Scott, Murphy & Presser, P.C.; Robert M. Trepp

(57) ABSTRACT

A simple and direct method of forming a SiGe-on-insulator that relies on the oxidation of a porous silicon layer (or region) that is created beneath a Ge-containing layer is provided. The method includes the steps of providing a structure comprising a Si-containing substrate having a hole-rich region formed therein and a Ge-containing layer atop the Si-containing substrate; converting the hole-rich region into a porous region; and annealing the structure including the porous region to provide a substantially relaxed SiGe-on-insulator material.

36 Claims, 7 Drawing Sheets

FORMATION OF A SILICON GERMANIUM-ON-INSULATOR STRUCTURE BY OXIDATION OF A BURIED POROUS SILICON LAYER

FIELD OF THE INVENTION

The present invention relates to a method of fabricating a semiconductor structure, and more particularly to a method of fabricating a SiGe-on-insulator (SGOI) structure in which wafer bonding and/or oxygen implantation is not employed in the fabrication process.

BACKGROUND OF THE INVENTION

In the semiconductor industry, there has recently been a high-level of activity using strained Si-based heterostructures to achieve high carrier mobility structures for CMOS applications. Traditionally, to boost performance of NFET and PFET devices, the prior art method to implement this has been to grow strained Si layers on thick (on the order of from about 1 to about 5 micrometers) relaxed SiGe buffer layers.

Despite the high channel electron mobilities reported for prior art heterostructures, the use of thick SiGe buffer layers has several noticeable disadvantages associated therewith. First, thick SiGe buffer layers are not typically easy to integrate with existing Si-based CMOS technology. Second, the defect densities, including threading dislocations (TDs) and misfit dislocations, are from about $10^6$ to about $10^8$ defects/cm$^2$ which are still too high for realistic VLSI (very large scale integration) applications. Thirdly, the nature of the prior art structure precludes selective growth of the SiGe buffer layer so that circuits employing devices with strained Si, unstrained Si and SiGe materials are difficult, and in some instances, nearly impossible to integrate.

In order to produce relaxed SiGe material on a Si substrate, prior art methods typically grow a uniform, graded or stepped SiGe layer to beyond the metastable critical thickness (i.e., the thickness beyond which dislocations form to relieve stress) and allow misfit dislocations to form, with the associated threading dislocations, through the SiGe buffer layer. Various buffer structures have been used in an attempt to increase the length of the misfit dislocation section in the structures and thereby to decrease the TD density.

When a typical prior art metastable strained SiGe layer is annealed at a sufficiently high temperature, misfit dislocations will form and grow thereby relieving the total strain on the film. In other words, the initial elastic strain of the film is relieved by the onset of plastic deformation of the crystal lattice. For the case of prior art metastable strained SiGe grown on silicon-on-insulator (SOI) substrates, experiments have shown that under most annealing/oxidation conditions, the formation of misfit dislocations occurs early in the annealing history for temperatures greater than ~700° C. Many of these defects are then either consumed or annihilated during the high-temperature annealing of the structure, however, the surface topography of the original misfit array persists during oxidation. Furthermore, SGOI substrate materials fabricated by thermal diffusion do not completely relax the SiGe alloy layer. Instead, the final SiGe lattice expands only to some fraction of the equilibrium value.

In addition to growing thick SiGe buffer layers atop an SOI substrate and then relaxing the SiGe layer by annealing/oxidation, it is also known to form SiGe-on-insulator substrates by wafer bonding and/or by oxygen implantation. Although these prior art processes are capable of forming relaxed SiGe-on-insulator substrates, they require additional processing steps, particularly in the case of wafer bonding, and/or add extra cost to the fabrication of SiGe-on-insulator substrates.

In view of the above drawbacks with the prior art, there is a need for providing a simple, yet low-cost method of forming high-quality, substantially relaxed SiGe-on-insulator substrates which can be used as a lattice mismatched template for forming a strained Si layer thereon.

SUMMARY OF THE INVENTION

One object of the present invention is to provide a method of fabricating a high-quality, substantially relaxed SiGe-on-insulator substrate material.

Another object of the present invention is to provide a method of fabricating a high-quality, substantially relaxed SiGe-on-insulator substrate material in which the substantially relaxed SiGe layer is thin (i.e., having a thickness on the order of about 2000 Å or less).

A further object of the present invention is to provide a method of fabricating a thin, high-quality, substantially relaxed SiGe-on-insulator substrate material that is thermodynamically stable against defect production such as misfit and threading dislocations.

A still further object of the present invention is to provide a method of fabricating a thin, high-quality, substantially relaxed SiGe-on-insulator substrate material that is compatible with complementary metal oxide semiconductor (CMOS) processing steps.

A yet further object of the present invention is to provide a method of fabricating a thin, high-quality, substantially relaxed SiGe-on-insulator substrate material which can then be used as a lattice mismatched template, i.e., substrate, for forming strained Si layers.

An even further object of the present invention is to provide a strained Si/substantially relaxed SiGe-on-insulator structure that has high carrier mobility and is useful in high-performance CMOS applications.

These and other objects and advantages are achieved in the present invention by utilizing a simple and direct method that relies on the oxidation of a porous silicon layer (or region) that is created beneath a Ge-containing layer. The method of the present invention provides a low cost alternative to prior art processes in which wafer bonding and/or oxygen implantation are used to fabricate SiGe-on-insulator (SGOI) substrate materials. Moreover, the inventive method for forming the SiGe-on-insulator substrate material is alone in its ability to simultaneously form a buried oxide region below a SiGe alloy layer without relying on wafer bonding and/or oxygen ion implantation techniques.

Specifically, and in broad terms, the method of the present invention includes the steps of:

providing a structure comprising a Si-containing substrate having a hole-rich region formed therein and a Ge-containing layer atop the Si-containing substrate;

converting the hole-rich region into a porous region; and annealing the structure including the porous region to provide a substantially relaxed SiGe-on-insulator material.

The porous region is formed in the present invention by utilizing an anodization processing step in which the anodization bath comprises a HF-containing solution. The anodization process creates porosity faster in regions that are rich in holes, i.e., regions including a high concentration of p-type dopant, than other regions of the structure. The annealing step of the present invention is performed under oxidation conditions so that the porous Si region is converted into a buried oxide region, while simultaneously forming a substantially relaxed SiGe alloy layer atop the buried oxide. A surface oxide also forms during the annealing step, which allows for effective intermixing and formation of a substantially relaxed SiGe-on-insulator substrate material.

DETAILED DESCRIPTION OF THE INVENTION

Figure 1A:
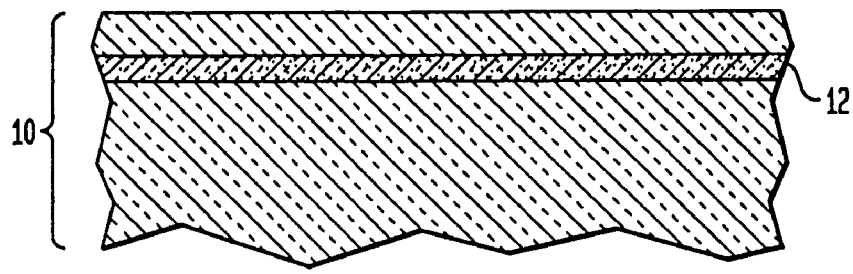
FIGS. 1A–1F are pictorial representations (through cross sectional views) illustrating the basic processing steps of the present invention.

The present invention, which provides a low-cost method for forming a substantially relaxed SiGe-on-insulator substrate material wherein wafer bonding and/or oxygen implantation are not employed, will now be described in greater detail by referring to the drawings that accompany the present application. In the accompanying drawings, like and/or corresponding elements are referred to by like reference numerals.

Reference is first made to FIGS. 1A–1F which illustrate an embodiment of the present invention in which a substantially relaxed SiGe alloy layer is formed atop a continuous buried oxide that extends entirely across the surface of a wafer. FIG. 1A shows a structure during the initial stage of the present invention. In particular, the structure illustrated in FIG. 1A includes a Si-containing substrate 10 in which a hole-rich region 12 is formed in the Si-containing substrate 10.

The term "Si-containing substrate" is used in the present invention to denote a semiconductor material that includes at least silicon. Illustrative examples of such Si-containing materials include, but are not limited to: Si, SiGe, SiC, SiGeC, Si/Si, Si/SiC, Si/SiGeC, and preformed silicon-on-insulators (SOIs) or SiGe-on-insulators which may include any number of buried insulating (i.e., continuous, non-continuous or a combination of continuous and non-continuous) regions therein. The Si-containing substrate used in the present invention may be undoped or it may be an electron-rich or hole-rich Si-containing substrate.

The hole-rich region 12 is a region that is more heavily doped than the surrounding Si-containing material. Typically, the hole-rich region contains a p-type dopant concentration of about 1E19 atoms/cm$^3$ or greater, with a p-type dopant concentration of from about 1E20 to about 5E20 atoms/cm$^3$ being more preferred.

In one embodiment of the present invention, the hole-rich region 12 can be formed by first growing a p-rich epitaxial layer on a surface of an initial Si-containing substrate and then growing a single crystal Si-containing layer having less doping than the p-rich epitaxial layer atop the previously grown layer. The p-rich epitaxial layer is grown using known epitaxial growth methods in which the dopant is included within the Si source gas. Examples of various epitaxial growth methods that may be used at this point of the present invention include, for example, low-pressure chemical vapor deposition (LPCVD), rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) and plasma-enhanced chemical vapor deposition (PECVD).

The thicknesses of the p-rich epitaxial layer and the single crystal Si-containing layer may vary depending on the final buried oxide thickness requirement in the SGOI or SOI layers. Typically, the p-rich epitaxial layer has a thickness of from about 5 to about 500 nm, with a thickness of from about 100 to about 200 nm being more highly preferred, while the single crystal Si-containing layer has a thickness of from about 50 to about 1000 nm, with a thickness of from about 100 to about 500 nm being more highly preferred.

The p-rich epitaxial layer and the single crystal Si-containing layer may be grown in two different steps or a single step, without breaking vacuum, may be used in forming the p-rich epitaxial layer and the single crystal Si-containing layer. In FIG. 1A, the single crystal Si-containing layer is located above the hole-rich region 12. The single crystal Si-containing layer may comprise the same or different Si material as the substrate 10.

In another embodiment of the present invention, the structure shown in FIG. 1A is formed by ion implanting a p-type dopant into an initial single crystal Si-containing substrate such that the peak concentration of the p-type dopant is at some predetermined depth that is below the upper surface of the substrate.

The term "p-type doping" is used herein to describe an element from Group III-A of the Periodic Table of Elements. Examples of p-type doping that can be employed in forming the hole-rich region include, but are not limited to: Ga, Al, B and BF$_2$. In the case of the p-type implants, B or BF$_2$ are particularly preferred in the present invention. In the preferred embodiments, boron with an energy of about 100 keV to 500 keV or BF$_2$ with an energy of about 500 keV to about 2500 keV and a dose of about 5E15 atoms/cm$^2$ to about 5E16 atoms/cm$^2$ can be used to form the hole-rich region 12.

In embodiments wherein ion implantation is used in forming the hole-rich region 12 into the Si-containing substrate 10, an optional annealing step may be performed to electrically activate B to create holes.

The annealing used at this point of the present invention may include a furnace anneal, a rapid thermal anneal, or a spike anneal. When a furnace anneal is employed, the furnace anneal is typically carried out at a temperature of about 600° C. or greater for a time period of about 15 minutes or greater. Preferably, the furnace anneal is performed at a temperature of from about 650° C. to about 800° C. for a time period of from about 15 to about 250 minutes. The furnace anneal is typically performed in the presence of an inert gas atmosphere and/or an oxidizing ambient including, for example, He, Ar, O$_2$, N$_2$ and mixtures thereof.

When a rapid thermal anneal (RTA) is employed, the RTA is typically carried out at a temperature of about 800° C. or greater for a time period of about 5 minutes or less. Preferably, the RTA is performed at a temperature of from about 900° C. to about 1050° C. for a time period of from about 5 to about 30 seconds. The RTA is typically performed in the presence of an inert gas atmosphere and/or an oxidizing ambient including, for example, He, Ar, $O_2$, $N_2$ and mixtures thereof.

When a spike anneal is performed, the spike anneal is typically performed at a temperature of about 900° C. or greater for a time period of about 1 second or less. Preferably, the spike anneal is performed at a temperature of from about 900° C. to about 1100° C. The spike anneal is typically performed in the presence of an inert gas atmosphere and/or an oxidizing ambient including, for example, He, Ar, $O_2$, $N_2$ and mixtures thereof.

After providing the structure shown in FIG. 1A, a Ge-containing layer 14 is then formed atop the upper surface of the Si-containing substrate 10, which includes the hole-rich region 12. The resultant structure including Ge-containing layer 14 is shown, for example, in FIG. 1B. The term "Ge-containing layer" denotes a pure Ge layer containing 100 atomic percent Ge or a SiGe alloy that includes up to 99.99 atomic percent Ge. When SiGe alloys are employed, it is preferred that the Ge content in the SiGe alloy be from about 0.1 to about 99.9 atomic percent, with a Ge atomic percent of from about 10 to about 35 atomic percent being more highly preferred.

In accordance with the present invention, the Ge-containing layer 14 is formed atop the upper surface of Si-containing substrate 10 using any conventional epitaxial growth method that is known to those skilled in the art which is capable of (i) growing a thermodynamically stable (below a critical thickness) Ge-containing layer, (ii) growing a Ge-containing layer that is metastable and substantially free from defects, i.e., misfit and TD dislocations or (iii) growing a Ge-containing layer that is relaxed and with defects.

Illustrative examples of such epitaxial growing processes that are capable of satisfy conditions (i), (ii) or (iii) include, but are not limited to: low-pressure chemical vapor deposition (LPCVD), rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) and plasma-enhanced chemical vapor deposition (PECVD).

The thickness of the Ge-containing layer 14 formed at this point of the present invention may vary, but typically Ge-containing layer 14 has a thickness of from about 10 to about 500 nm, with a thickness of from about 20 to about 200 nm being more highly preferred.

Figure 1B:
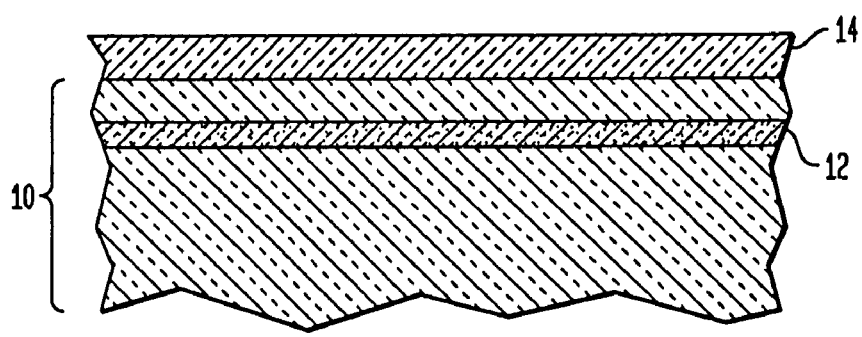
Figure 1C:
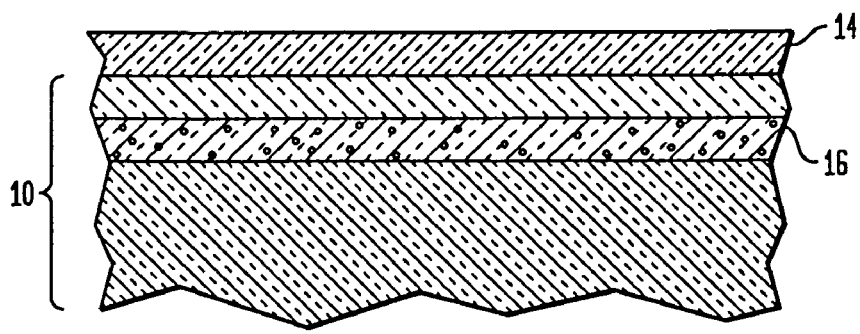
Figure 1D:
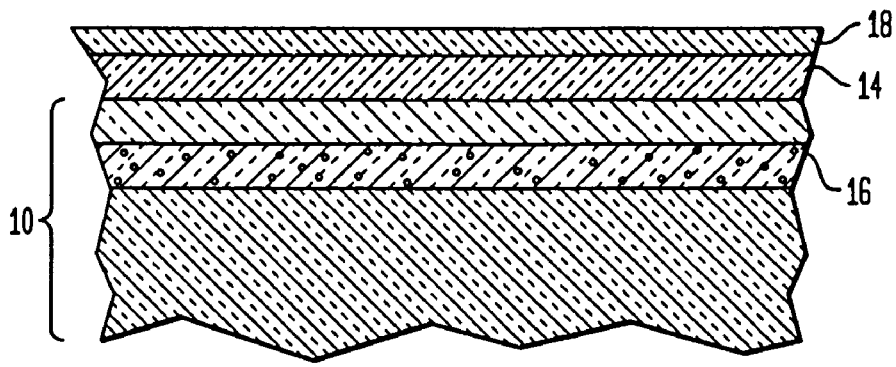

In an optional embodiment of the present invention, the steps used in forming the structures shown in FIGS. 1A and 1B may be combined by epitaxially growing all of the layers in a single deposition step. Namely, epitaxial growth of the hole-rich region followed by growth of a single crystal Si layer and then growth of the Ge-containing layer.

In yet another alternative embodiment of the present invention, the hole-rich region 12 is introduced into the structure after the Ge-containing layer 14 has been formed atop a Si-containing substrate 10. In such an embodiment, the hole-rich region 12 is formed via ion implantation after formation of the Ge-containing layer 14 therefore obviating the need for two separate processing steps. Following the ion implantation step, one of the above mentioned annealing techniques is used to activate the dopants.

Next, the structure shown in FIG. 1B is subjected to an electrolytic anodization process that is capable of converting the hole-rich region 12 into a porous region 16. The resultant structure including porous region 16 that is formed after the anodization process is shown, for example, in FIG. 1C.

The anodization process is performed by immersing the structure shown in FIG. 1B into an HF-containing solution while an electrical bias is applied to the structure with respect to an electrode also placed in the HF-containing solution. In such a process, the structure typically serves as the positive electrode of the electrochemical cell, while another semiconducting material such as Si, or a metal is employed as the negative electrode.

In general, the HF anodization converts p-doped single crystal Si into porous Si. The rate of formation and the nature of the porous Si so-formed (porosity and microstructure) is determined by both the material properties, i.e., doping type and concentration, as well as the reaction conditions of the anodization process itself (current density, bias, illumination and additives in the HF-containing solution). Specifically, the porous Si forms with greatly increased efficiency in the higher doped regions and therefore, the buried hole-rich region 12 is converted into porous Si efficiently.

Generally, the porous Si region 16 formed in the present invention has a porosity of about 0.1% or higher. The depth of the porous Si region 16, as measured from the uppermost surface of the structure to the uppermost surface of the porous Si, is about 50 nm or greater.

The term "HF-containing solution" includes concentrated HF (49%), a mixture of HF and water, a mixture of HF and a monohydric alcohol such as methanol, ethanol, propanol, etc, or HF mixed with at least one surfactant. The amount of surfactant that is present in the HF solution is typically from about 1 to about 50%, based on 49% HF.

The anodization process, which converts the hole-rich region 12 into a porous Si region 16, is performed using a constant current source that operates at a current density of from about 0.05 to about 50 milliAmps/cm$^2$. A light source may be optionally used to illuminate the sample. More preferably, the anodization process of the present invention is employed using a constant current source operating at a current density of from about 0.1 to about 5 milliAmps/cm$^2$.

The anodization process is typically performed at room temperature or at a temperature that is elevated from room temperature may be used. Following the anodization process, the structure is typically rinsed with deionized water and dried.

In an optional embodiment of the present invention, an optional cap layer 18 is formed atop the Ge-containing layer 14 at this point of the present invention. The structure including the optional cap layer 18 is shown, for example, in FIG. 1D. The optional cap layer 18 employed in the present invention comprises any Si material including, for example, epitaxial Si (epi-Si), amorphous Si (a:Si), single or polycrystalline Si or any combination thereof. Of the various Si materials listed above, it is preferred that epi-Si be employed as the optional cap layer 18.

When present, the optional cap layer 18 has a thickness of from about 1 to about 100 nm, with a thickness of from about 1 to about 30 nm being more highly preferred. The optional cap layer 18 is formed using known deposition processes including one of the epitaxial growth processes mentioned above.

The structure including the Ge-containing layer 14 and the thus formed porous Si region 16, with or without the optional cap layer 18, (see, FIG. 1C or FIG. 1D) is then heated, i.e., annealed, at a temperature which permits inter-diffusion of Ge mostly within the single crystal Si layer above the porous Si, thereby forming a substantially relaxed, single crystal SiGe layer 22, while simultaneously converting the porous Si region 16 into a buried oxide region 20.

Figure 1E:
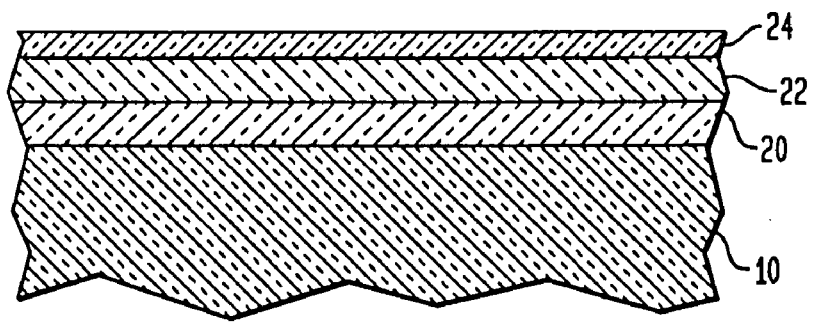

The resultant structure is shown, for example, in FIG. 1E. That is, the heating step forms a relaxed single crystal SiGe layer 22 atop a buried oxide layer 20. Note that an oxide layer 24 is formed atop layer 22 during the heating step. This surface oxide layer, i.e., oxide layer 24, is typically, but not always, removed from the structure after the heating step using a conventional wet etch process wherein a chemical etchant such as HF that has a high selectivity for removing oxide as compared to SiGe is employed.

Note that when the oxide layer is removed, a second single crystal Si layer that is strained or unstrained depending on the relaxation of the SiGe layer can be formed atop layer 22 and the above processing steps of the present invention may be repeated any number of times to produce a multilayered relaxed SiGe substrate material. The measured strain of the second Si layer is typically from 0% to about 1.5%.

The surface oxide layer 24 formed after the heating step of the present invention has a variable thickness which may range from about 10 to about 1000 nm, with a thickness of from about 20 to about 500 nm being more highly preferred.

Specifically, the heating step of the present invention is an annealing step which is performed at a temperature of from about 650° to about 1350° C., with a temperature of from about 1200° to about 1320° C. being more highly preferred. Moreover, the heating step of the present invention is carried out in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. When a diluted ambient is employed, the diluted ambient contains from about 0.5 to about 100% of oxygen-containing gas, the remainder, up to 100%, being inert gas.

The heating step may be carried out for a variable period of time that typically ranges from about 10 to about 1800 minutes, with a time period of from about 60 to about 600 minutes being more highly preferred. The heating step may be carried out at a single targeted temperature, or various ramp and soak cycles using various ramp rates and soak times can be employed.

The heating step is performed under an oxidizing ambient to achieve the presence of oxide layers, i.e., layers 20 and 24, which act as diffusion barriers to Ge atoms. Note that the porous Si region reacts with diffused oxygen at an enhanced rate. Once the oxide layers (surface and buried oxide) are formed, Ge becomes trapped between the oxide layers. As the oxidation process continues and consumption of the Ge-containing layer and single crystal occurs, the ratio of Ge to Si in the alloy layer increases because the Ge is rejected from the oxide and Si is incorporated into the growing surface oxide layer.

Efficient thermal mixing is achieved in the present invention when the heating step is carried out at a temperature of from about 1200° to about 1320° C. in a diluted oxygen-containing gas.

It is also contemplated herein to use a tailored heat cycle that is based upon the melting point of the SiGe layer. In such an instance, the temperature is adjusted to tract below the melting point of the SiGe layer.

Note that if the oxidation occurs too rapidly, Ge cannot diffuse away from the surface oxide/SiGe interface fast enough and is either transported through the oxide (and lost) or the interfacial concentration of Ge becomes so high that the alloy melting temperature will be reached.

The role of the heating step of the present invention is (1) to allow Ge atoms to diffuse more quickly thereby maintaining a homogeneous distribution during annealing; (2) to subject the ('initially') strained layer structure to a thermal budget which will facilitate an equilibrium configuration, and (3) to convert the porous Si region into a thermal buried oxide region. After this heating step has been performed, the structure includes a uniform and substantially relaxed SiGe alloy layer, i.e., layer 22, sandwiched between the buried oxide layer 20 and surface oxide layer 24.

In accordance with the present invention, substantially relaxed SiGe layer 22 has a thickness of about 2000 nm or less, with a thickness of from about 10 to about 100 nm being more highly preferred. Note that the substantially relaxed SiGe layer 22 formed in the present invention is thinner than prior art SiGe buffer layers and has a defect density including misfits and TDs, of less than about $10^8$ defects/$cm^2$. The buried oxide layer 20 formed during the heating step has a thickness of about 50 nm to about 500 nm, with a thickness of from about 100 to about 200 nm being more highly preferred. The buried oxide layer 20 has a smooth and continuous interface with the overlying substantially relaxed SiGe layer 22.

The substantially relaxed SiGe layer 22 formed in the present invention has a final Ge content of from about 0.1 to about 99.9 atomic percent, with an atomic percent of Ge of from about 10 to about 35 being more highly preferred. Another characteristic feature of the substantially relaxed SiGe layer 22 is that it has a measured lattice relaxation of from about 1 to about 100%, with a measured lattice relaxation of from about 50 to about 80% being more highly preferred.

Figure 1F:
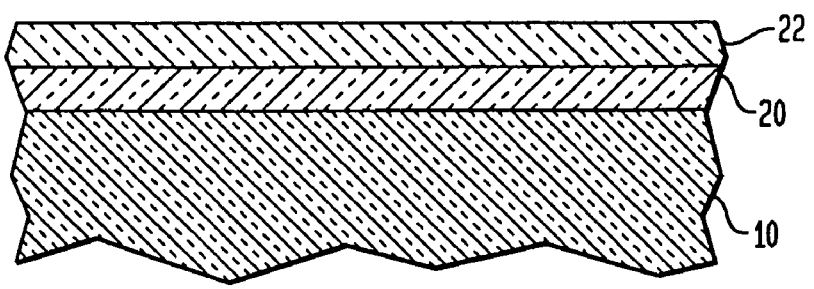

As stated above, the surface oxide layer 24 may be stripped at this point of the present invention so as to provide the SiGe-on-insulator substrate material shown, for example, in FIG. 1F.

Figure 2A:
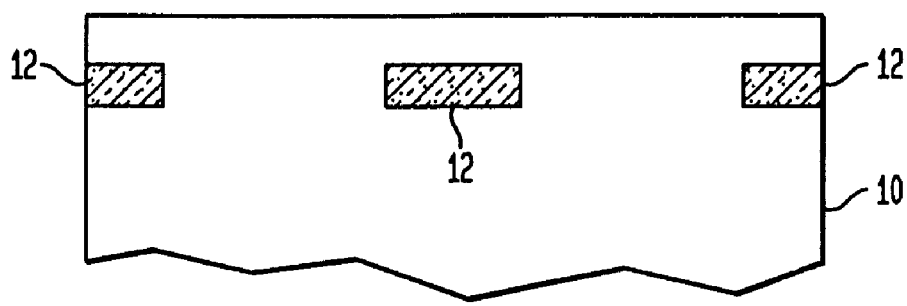
FIGS. 2A–2C are pictorial representations (through cross sectional views) illustrating an alternative embodiment of the present invention.

In addition to the unpatterned structure shown in FIGS. 1A–1F above, the present invention also contemplates the formation of a patterned structure. The patterned structure and the process used in forming the same is shown, for example, in FIGS. 2A–2C. Specifically, FIG. 2A shows an initial structure of this embodiment in which the Si-containing substrate 10 has discrete and isolated islands of hole-rich regions 12 formed therein. The discrete hole-rich regions 12 may be formed by using a masked ion implantation process or by growing a continuous hole-rich layer and subjecting the newly grown layer to lithography and etching. After the etching step, a single crystal Si layer is grown over the entire structure providing the structure shown in FIG. 2A.

Figure 2B:
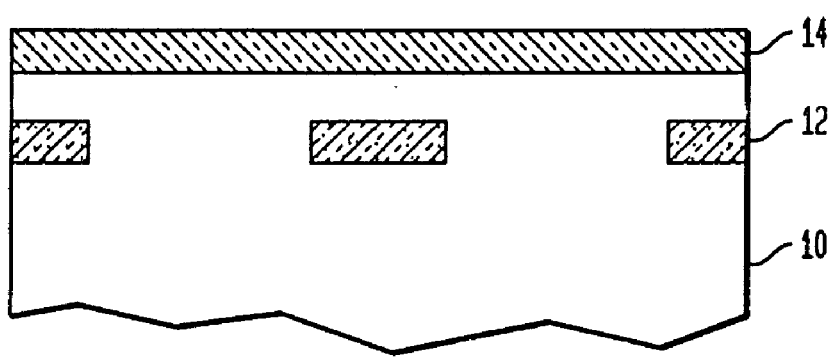

FIG. 2B shows the structure that is formed after Ge-containing layer 14 is formed on the surface of the structure shown in FIG. 2A. The Ge-containing layer 14 is formed utilizing one of the above mentioned epitaxial growth methods. As with the embodiment described in FIGS. 1A–1F, hole-rich region 12 may be formed into substrate 10 after formation of Ge-containing layer 14 onto substrate 10. Next, the structure shown in FIG. 2B including the Ge-containing 14 and hole-rich region 12 is subjected to the above described anodization process. As stated above, the anodization process forms porous Si regions 16 in the substrate in the hole-rich region. An optional cap layer, not shown, may then be formed atop the structure.

Figure 2C:
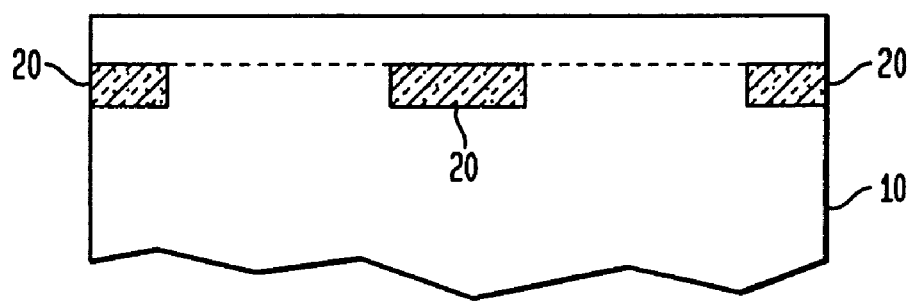

The structure, with or without the optional cap layer, is then subjected to the above-described annealing step providing the structure shown, for example, in FIG. 2C. Note that reference numerals 10, 20 and 22 have the same meaning as described above; the surface oxide layer 24 has been removed from this structure.

Figure 3A:
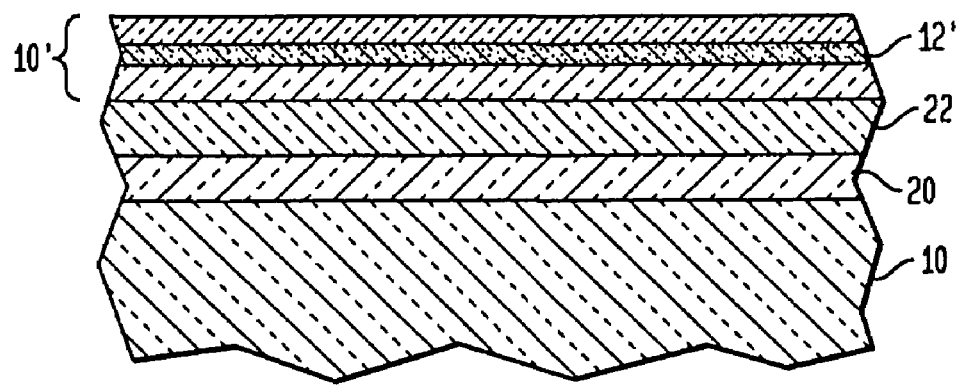
FIGS. 3A–3B are pictorial representations (through cross sectional views) illustrating an alternative embodiment of the present invention.
Figure 3B:
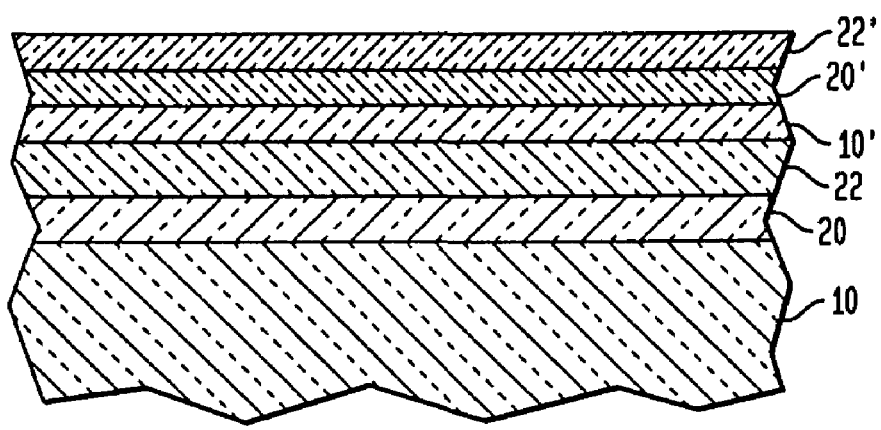

FIGS. 3A–3B show another alternative embodiment of the present invention in which a double SGOI layer is formed in the same structure. The double SGOI layer is formed by first performing the steps described above in providing the structure shown in FIG. 1F. After providing the structure, a Si-containing layer 10' having a hole-rich region 12' is formed atop the structure and then a Ge-containing layer 14' is formed atop the Si-containing layer 10'. It is also possible to form layers 10' and 14' first and then form hole-rich region 12' into layer 10'. FIG. 3A provides an illustration of this structure. Next, the steps of anodization and annealing are repeated providing the structure shown, for example, in FIG. 3B. In FIG. 3B, a second buried oxide layer 20' is formed as well as a second substantially relaxed SiGe layer 22'. The same procedure can be repeated numerous times to provide a multi-SGOI layered structure. The multi-SGOI layers may all be continuous, be discontinuous or they may exist as a combination thereof.

Figure 4:
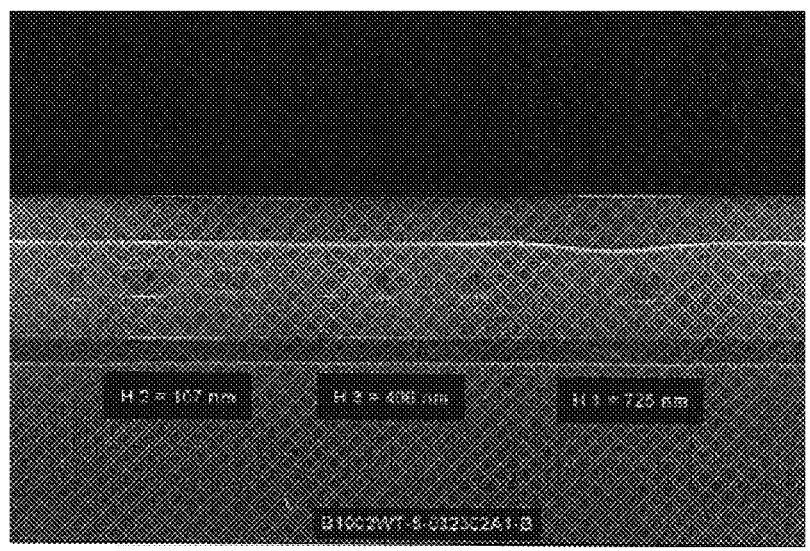
FIG. 4 is a cross-sectional SEM image of a SiGe-on-insulator material formed using the method of the present invention.
Figure 5:
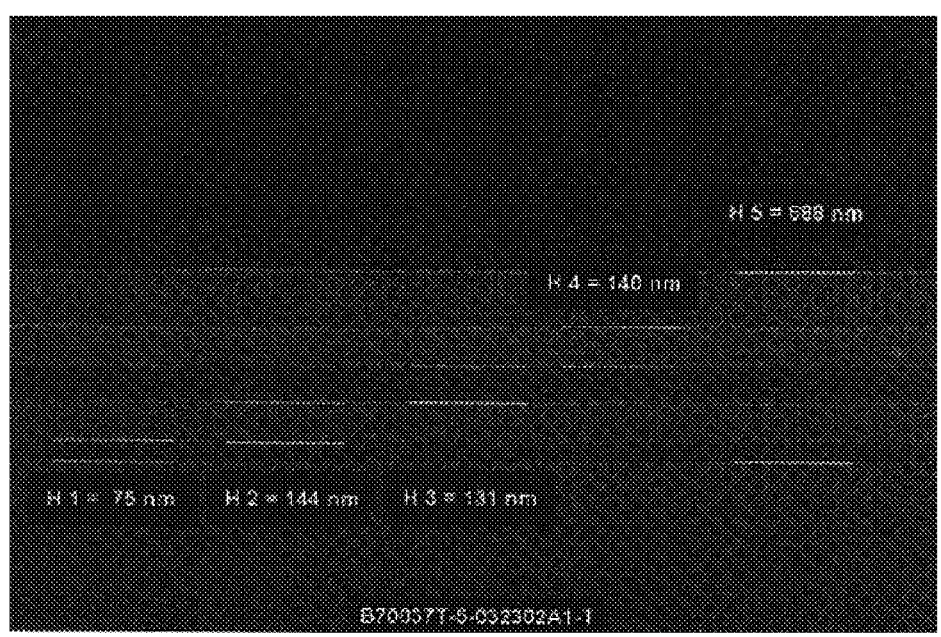
FIG. 5 is a cross-sectional SEM image of a double-layered SiGe-on-insulator material formed by the method of the present invention.

FIGS. 4 and 5 show actual SEM images of the substantially relaxed SiGe-on-insulator substrate materials produced using the method of the present invention. FIG. 4 is a cross-sectional SEM image of a SGOI substrate material formed by oxidation of a porous Si layer. The thin dark band labeled as H2 (107 nm) is the buried oxide layer. The layer above it, H3 (406) is the SiGe layer at 2 at. % Ge. The small voids within the layer are the attempted formation of a second buried oxide layer. The uppermost gray layer is the surface oxide. FIG. 5 is a cross-sectional SEM image of a double-layered SGOI substrate material formed by oxidation of porous Si. The thin dark band labeled as H1 (75 nm) is the first buried oxide layer. The layer above it, H2 (144 nm) is the first SiGe layer (0.2 at. % Ge). The next dark band labeled as H3 (131 nm) is the second buried oxide layer and the next layer, H4 (140 nm) is the second SiGe layer (4.5 at. % Ge). The uppermost dark-gray layer is the surface oxide layer.

Figure 6:
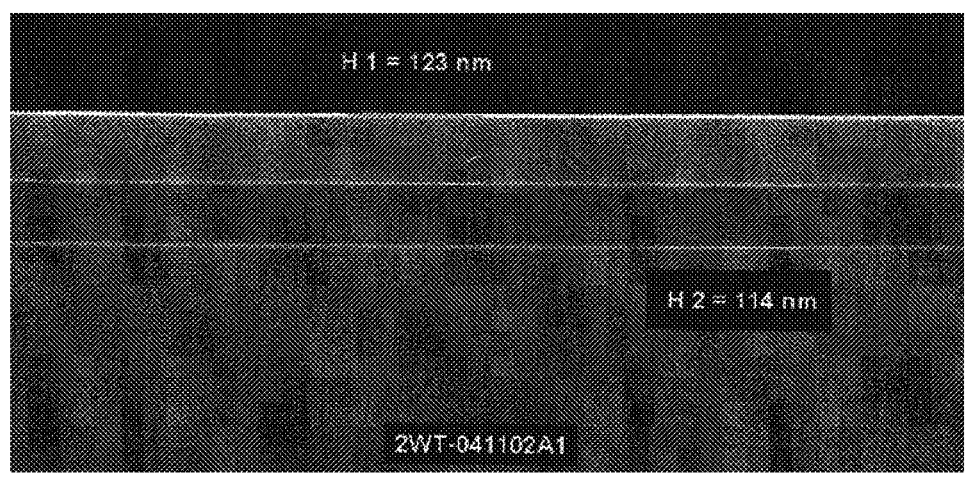
FIG. 6 is a cross-sectional SEM image of a SGOI substrate of the present invention.

FIG. 6 shows a SGOI structure obtained from similar substrates as shown in FIGS. 4 and 5 but after increased oxidation during high temperature anneal such that the top SGOI and BOX layers in FIGS. 4 and 5 are consumed by the increased oxidation. Increased oxidation can be accomplished either by increasing oxygen concentration in the anneal ambient compared to that used for annealing the structures shown in FIGS. 4 and 5, or by increasing anneal time with the same oxygen concentration as that used to create structures of FIGS. 4 and 5. FIG. 6 is a cross-sectional SEM image of a SGOI. The thin dark band labeled as H1 (123 nm) is the SGOI layer with an estimated 4.5% Ge. The thin dark band labeled as H2 (114 nm) is the BOX layer. The uppermost dark-gray layer is the surface oxide layer.

After performing any of the embodiments mentioned above, a Si layer may be formed atop the SiGe layer using conventional epitaxial deposition process well-known to those skilled in the art. The thickness of the epi-Si layer may vary, but typically, the epi-Si layer has a thickness of from about 1 to about 100 nm.

In some instances, additional SiGe can be formed atop the relaxed SiGe layer utilizing the above mentioned processing steps and thereafter epi-Si may be formed. Because the relaxed SiGe layer has a large in-plane lattice parameter as compared to the epi-Si layer, the epi-Si layer will be strained in a tensile manner.

The present invention also contemplates superlattice structures as well as lattice mismatched structures that include at least the SiGe-on-insulator substrate material of the present invention. In the case of the superlattice structures, such structures would include at least the substantially relaxed SiGe-on-insulator substrate material of the present invention, and alternating Si and SiGe layers formed atop the substrate material.

In the case of lattice mismatch structures, GaAs, GaP or other like compounds would be formed atop the substantially relaxed SiGe-on-insulator substrate material of the present invention.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of fabricating a SiGe-on-insulator substrate material comprising:

providing a structure comprising a Si-containing substrate having a hole-rich region formed therein and a Ge-containing layer atop the Si-containing substrate, said providing includes one of (i) growing a p-rich epitaxial layer on an initial Si-containing substrate, forming a single crystal Si-containing layer atop the p-rich epitaxial layer, and forming the Ge-containing layer on the single crystal Si-containing layer, (ii) ion implanting a p-type dopant into an initial single crystal Si-containing substrate and then forming the Ge-containing layer on the substrate, or (iii) forming the Ge-containing layer on an initial single crystal Si-containing substrate and then implanting p-type dopant into the substrate to form said hole-rich region;

converting the hole-rich region into a porous region; and annealing the structure including the porous region to provide a substantially relaxed SiGe-on-insulator material.

2. The method of claim 1 wherein the providing step comprises (i).

3. The method of claim 1 wherein the providing step comprises (ii).

4. The method of claim 3 wherein the p-type dopant is Ga, Al, B or $BF_2$.

5. The method of claim 3 wherein the p-type dopant is B, said B is implanted at an energy of from about 100 keV to about 500 keV and a dose of about 5E15 atoms/$cm^2$ to about 5E16 atom/$cm^2$.

6. The method of claim 3 wherein the p-type dopant is $BF_2$, said $BF_2$ is implanted at an energy of from about 500 keV to about 2500 keV and a dose of about 5E15 atoms/$cm^2$ to about 5E16 atom/$cm^2$.

7. The method of claim 3 further comprising an activation annealing step which is performed prior to said converting step.

8. The method of claim 7 wherein the activation annealing step is selected from the group consisting of a furnace anneal, a rapid thermal anneal, and a spike anneal.

9. The method of claim 8 wherein the activation annealing step is a furnace anneal step, said furnace anneal step is carried out at a temperature of about 600° C. or greater for a time period of about 15 minutes or greater in the presence of an inert gas atmosphere, an oxidizing ambient or a mixture thereof.

10. The method of claim 8 wherein the activation annealing step is a rapid thermal anneal (RTA) step, said RTA step is carried out at a temperature of about 800° C. or greater for a time period of about 5 minutes or less in the presence of an inert gas atmosphere, an oxidizing ambient or a mixture thereof.

11. The method of claim 8 wherein the activation annealing step is a spike annealing step, said spike annealing step is performed at a temperature of about 900° C. or greater for a time period of about 1 second or less in the presence of an inert gas atmosphere, an oxidizing ambient or a mixture thereof.

12. The method of claim 1 wherein the providing step comprises (iii).

13. The method of claim 12 further comprising an activation annealing step which is performed prior to said converting step.

14. The method of claim 13 wherein the activation annealing step is selected from the group consisting of a furnace anneal, a rapid thermal anneal, and a spike anneal.

15. The method of claim 14 wherein the activation
annealing step is a furnace anneal step, said furnace anneal step is carried out at a temperature of about 600° C. or greater for a time period of about 15 minutes or greater in the presence of an inert gas atmosphere, an oxidizing ambient or a mixture thereof.

16. The method of claim 14 wherein the activation annealing step is a rapid thermal anneal (RTA) step, said RTA step is carried out at a temperature of about 800° C. or greater for a time period of about 5 minutes or less in the presence of an inert gas atmosphere, an oxidizing ambient or a mixture thereof.

17. The method of claim 14 wherein the activation annealing step is a spike annealing step, said spike annealing step is performed at a temperature of about 900° C. or greater for a time period of about 1 second or less in the presence of an inert gas atmosphere, an oxidizing ambient or a mixture thereof.

18. The method of claim 1 wherein said hole-rich region has a p-type dopant concentration of about 1E19 atoms/cm$^3$ or greater.

19. The method of claim 18 wherein said hole-rich region has a p-type
dopant concentration of from about 1E20 atoms/cm$^3$ to about 5E20 atoms/cm$^3$.

20. The method of claim 1 wherein the converting step comprising an electrolytic anodization process.

21. The method of claim 20 wherein the anodization process is performed in the presence of a HF-containing solution.

22. The method of claim 20 wherein the anodization process is performed using a constant current source operating at a current density of from about 0.05 to about 50 milliAmps/cm$^2$.

23. The method of claim 1 wherein the porous region has a porosity of about 1% or greater.

24. The method of claim 1 further comprising forming a cap layer atop the Ge-containing layer after said converting step, but prior to said annealing step.

25. The method of claim 24 wherein the cap layer comprises a Si material.

26. The method of claim 1 wherein the annealing step is performed in an oxygen-containing ambient.

27. The method of claim 26 wherein the oxygen-containing ambient further comprises an inert gas.

28. The method of claim 27 wherein the oxygen-containing ambient is selected from the group consisting of $O_2$, NO, $N_2O$, ozone, and air.

29. The method of claim 1 wherein the annealing step is performed at a temperature of from about 650° C. to about 1350° C.

30. The method of claim 1 wherein the annealing step forms a surface oxide atop the substantially relaxed SiGe-on-instalator material.

31. The method of claim 1 wherein the insulator of said SiGe-on-insulator material is a thermal oxide.

32. The method of claim 1 further comprising forming a Si layer atop the substantially relaxed SiGe-on-insulator material.

33. The method of claim 1 wherein the hole-rich regions is continuous.

34. The method of claim 1 wherein the hole-rich region comprises discrete islands and said insulator of said substantially relaxed SiGe-on-insulator material comprises discrete islands of thermal oxide.

35. The method of claim 1 further comprising repeating the providing, converting and annealing steps any number of times to provide a multi-layered SiGe-on-insulator material.

36. A method of fabricating a SiGe-on-insulator substrate material comprising:
providing a structure comprising a Si-containing substrate having a region of a high concentration of p-type dopant formed therein and a Ge-containing layer atop the Si-containing substrate, said providing includes one of (i) growing a p-rich epitaxial layer on an initial Si-containing substrate, forming a single crystal Si-containing layer atop the p-rich epitaxial layer, and forming the Ge-containing layer on the single crystal Si-containing layer, (ii) ion implanting the p-type dopant into an initial single crystal Si-containing substrate and then forming the Ge-containing layer on the substrate, or (iii) forming the Ge-containing layer on an initial single crystal Si-containing substrate and then implanting the p-type dopant into the substrate;
converting the region of p-type dopant into a porous region using an anodization process, wherein an HF-containing solution is employed; and
oxidizing the structure including the porous region to provide a substantially relaxed SiGe-on-insulator material.

* * * * *